US009360542B2

United States Patent
Reeder et al.

(10) Patent No.: US 9,360,542 B2
(45) Date of Patent: Jun. 7, 2016

(54) SYSTEM AND METHOD FOR SPECTRALLY-RESOLVED THREE-DIMENSIONAL MAGNETIC RESONANCE IMAGING WITHOUT FREQUENCY-ENCODING GRADIENTS

(75) Inventors: Scott Brian Reeder, Middleton, WI (US); Nathan Samuel Artz, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 886 days.

(21) Appl. No.: 13/451,773

(22) Filed: Apr. 20, 2012

(65) Prior Publication Data
US 2013/0278254 A1 Oct. 24, 2013

(51) Int. Cl.
*G01R 33/485* (2006.01)
*G01R 33/565* (2006.01)
*G01R 33/48* (2006.01)

(52) U.S. Cl.
CPC ........ *G01R 33/485* (2013.01); *G01R 33/56563* (2013.01); *G01R 33/4822* (2013.01); *G01R 33/4826* (2013.01)

(58) Field of Classification Search
CPC ........... G01R 33/56563; G01R 33/485; G01R 33/4822; G01R 33/4826; G01R 33/482; G01R 33/4825; G01R 33/5611; G01R 33/5612; G01R 33/4828; G01R 33/5607
See application file for complete search history.

(56) References Cited

U.S. PATENT DOCUMENTS

| 5,446,384 | A | * | 8/1995 | Dumoulin | 324/307 |
| 5,570,019 | A | * | 10/1996 | Moonen et al. | 324/307 |
| 2004/0100258 | A1 | * | 5/2004 | Gurr | 324/307 |
| 2006/0139027 | A1 | * | 6/2006 | Dreher et al. | 324/307 |
| 2010/0036235 | A1 | * | 2/2010 | Lamerichs et al. | 600/410 |
| 2012/0313641 | A1 | * | 12/2012 | Labadie et al. | 324/309 |
| 2014/0043022 | A1 | * | 2/2014 | Geerts-Ossevoort et al. | 324/306 |

OTHER PUBLICATIONS

Artz et al., Spectrally Resolved Fully Phase-Encoded Three-Dimensional Fast Spin-Echo Imaging, 2014, Magnetic Resonance in Medicine, 71, 681-690.*
Lustig et al., Sparse MRI: The Application of Compressed Sensing for Rapid MR Imaging, 2007, Magnetic Resonance in Medicine, 58, 1182-1195.*

(Continued)

*Primary Examiner* — Dixomara Vargas
(74) *Attorney, Agent, or Firm* — Quarles & Brady, LLP

(57) ABSTRACT

A system and method for acquiring spectrally-resolved three-dimensional data with a magnetic resonance imaging ("MRI") system without frequency-encoding gradients are provided. An MRI system is directed to produce a radio frequency ("RF") pulse that rotates net magnetization about an axis, after which a first phase-encoding gradient is established along a first direction, a second phase-encoding gradient is established along a second direction that is orthogonal to the first direction, and a third phase-encoding gradient is established along a third direction that is orthogonal to the first and second directions. Spectrally-resolved data are acquired at a point in k-space that is defined by the first, second, and third phase-encoding gradients, and is acquired by sampling a magnetic resonance signal at a plurality of time points during a period of time in which no magnetic field gradients are established by the MRI system.

21 Claims, 5 Drawing Sheets

(56) References Cited

OTHER PUBLICATIONS

Carr, Steady-State Free Precession in Nuclear Magnetic Resonance, 1958, Phys Rev, 112, 1693-1701.Chavhan GB, Babyn PS, Jankharia BG et al. Steady-state MR imaging sequences: physics, classification, and clinical applications. Radiographics 2008;28:1147-1160.*

Chavhan et al., Steady-state MR imaging sequences: physics, classification, and clinical applications, Radiographics, 2008, 28, 1147-1160.*

Balcom, et al., Single-Point Ramped Imaging with T1 Enhancement (SPRITE), Journal of Magnetic Resonance, Series A, 1996, 123(1):131-134.

Busse, et al., Fast Spin Echo Sequences with Very Long Echo Trains: Design of Variable Refocusing Flip Angle Schedules and Generation of Clinical T2 Contrast, Magnetic Resonance in Medicine, 2006, 55(5):1030-1037.

Koch, et al., A Multispectral Three-Dimensional Acquisition Technique for Imaging Near Metal Implants, Magnetic Resonance in Medicine, 2009, 61(2):381-390.

Koch, et al., Imaging Near Metal with a MAVRIC-SEMAC Hybrid, Magnetic Resonance in Medicine, 2011, 65 (1):71-82.

Koch, et al., Frequency Encoding in the Presence of Extreme Static Field Gradients, Proceedings of the International Society of Magnetic Resonance in Medicine, 2011, 19:293.

Lu, et al., SEMAC: Slice Encoding for Metal Artifact Correction in MRI, Magnetic Resonance in Medicine, 2009, 62(1):66-76.

Lustig, et al., SPIRiT: Iterative Self-Consistent Parallel Imaging Reconstruction from Arbitrary k-Space, Magnetic Resonance in Medicine, 2010, 64(2):457-471.

* cited by examiner

SYSTEM AND METHOD FOR SPECTRALLY-RESOLVED THREE-DIMENSIONAL MAGNETIC RESONANCE IMAGING WITHOUT FREQUENCY-ENCODING GRADIENTS

STATEMENT REGARDING FEDERALLY SPONSORED RESEARCH

This invention was made with government support under DK083380, DK088925, and EB010384 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for spectrally-resolved three-dimensional MRI without using frequency-encoding gradients.

Acquiring images with MRI in the presence of metal objects is challenging because of off-resonance, signal loss, and signal pile-up artifacts that occur in the highly inhomogeneous magnetic field environment surrounding the metal object, or in other regions of magnetic field inhomogeneities. Recently, new methods aimed at improving the reliability of MRI in the presence of metal objects have been proposed; however, these methods still have significant limitations.

One method, referred to as MAVRIC, reduces through-plane distortion artifacts, and utilizes a three-dimensional acquisition for many distinct frequency bins that encompass the distribution of frequencies found near the metal object. The signals acquired in these disparate frequency bins for each voxel are summed together to produce the final image.

Another method referred to as SEMAC addressed through-plane distortion artifacts by employing phase-encoding along the slice-encoding direction for each slice select excitation, thereby resolving non-linear slice profiles.

Although the MAVRIC and SEMAC methods approached the problem of performing MRI in the presence of metal objects from different perspectives, they both solved the problem in a similar manner: by utilizing three-dimensional imaging at distinct frequency bins. For this reason, the MAVRIC and SEMAC methods have also been combined into a hybrid method that demonstrated improved imaging capabilities.

Although these methods have demonstrated improved imaging in the presence of metal objects, they still suffer from in-plane spatial distortions along the frequency-encoding dimension. These distortions occur because these methods acquire data during the use of a frequency-encoding gradient, which leads to pile-up artifacts and distortions. While view-angle tilting and Jacobian methods can be used to help reduce in-plane signal loss and pile-up errors near metal objects, errors are unavoidable in voxels where the local gradient inside the voxel exceeds that of the frequency-encoding gradient. Thus, all imaging methods that utilize a frequency-encoding gradient for spatial encoding are limited in their ability to eliminate in-plane signal loss and pile-up.

It would therefore be highly desirable to provide a method for magnetic resonance imaging ("MRI") in which frequency-encoding-related shift artifacts are not present. Furthermore, it would be desirable to provide such a method that would be capable of measuring local magnetic field inhomogeneities, characterizing different chemical species, and measuring relaxation rates of transverse magnetization, $R^*_2$, by way of chemical shift encoding.

SUMMARY OF THE INVENTION

The present invention overcomes the aforementioned drawbacks by providing a system and method for performing spectrally-resolved three-dimensional magnetic resonance imaging ("MRI") without using a frequency-encoding gradient. This method allows for spectral encoding of magnetic resonance signals, such that local magnetic field inhomogeneities can be measured, chemical species signal separation can be performed, and the relaxation rate of transverse magnetization, $R^*_2$, can be measured.

It is an aspect of the invention to provide a method for acquiring spectrally-resolved, three-dimensional data with an MRI system that directs the MRI system to produce a radio frequency ("RF") pulse that rotates net magnetization about an axis. The MRI system is then directed to establish a first phase-encoding gradient along a first direction, establish a second phase-encoding gradient along a second direction that is orthogonal to the first direction, and establish a third phase-encoding gradient along a third direction that is orthogonal to the first direction and the second direction. Data are then acquired at a point in k-space that is defined by the first, second, and third phase-encoding gradients by sampling a magnetic resonance signal at a plurality of time points during a period of time in which no magnetic field gradients are established by the MRI system.

It is another aspect of the invention to provide an MRI system that includes a magnet system configured to generate a polarizing magnetic field about at least a portion of a subject arranged in the MRI system, a plurality of gradient coils configured to establish at least one magnetic gradient field to the polarizing magnetic field, a radio frequency (RF) system configured to apply an RF field to the subject and to receive magnetic resonance signals therefrom, and a computer system. The computer system is programmed to direct the RF system to produce an RF pulse that rotates net magnetization about an axis, direct the plurality of gradient coils to establish a first phase-encoding gradient along a first direction, direct the plurality of gradient coils to establish a second phase-encoding gradient along a second direction that is orthogonal to the first direction, and direct the plurality of gradient coils to establish a third phase-encoding gradient along a third direction that is orthogonal to the second direction. The computer system is also programmed to direct the RF system to receive a magnetic resonance signal generated in response to the produced RF pulse, to acquire data at a point in k-space that is defined by the first, second, and third phase-encoding gradients by sampling the received magnetic resonance signal at a plurality of time points during a data acquisition window, and to direct the plurality of gradient coils not to establish a magnetic field gradient during the data acquisition window.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A system and method for spectrally-resolved three-dimensional magnetic resonance imaging ("MRI") without using frequency-encoding gradients is provided. Rather than use a frequency-encoding gradient for spatial encoding, the system and method of the present invention make use phase-encoding along three spatial dimensions. This approach has the benefit of avoiding artifacts traditionally caused by frequency-encoding gradients, such as off-resonance artifacts. Moreover, this approach allows for independent and highly customizable sampling of k-space. Each spatially-encoded magnetic resonance signal is sampled at multiple time points, thereby providing the acquisition of spectrally-resolved data. Because each magnetic resonance signal is independently sampled, a significant gain in signal-to-noise ratio ("SNR") is achieved over many existing imaging techniques. In addition, spectral data can be efficiently acquired at spatial resolutions common to convention MRI techniques.

The method of the present invention is different from existing single point imaging ("SPI") methods, such as single point ramped imaging with $T_1$ enhancement ("SPRITE") and point-wise encoding time reduction with radial acquisition ("PETRA") techniques, which rely on the formation of gradient-echoes that inherently suffer from signal loss in voxels with large local magnetic field gradients produced by $T_2^*$ dephasing. Methods such as SPRITE and PETRA also do not allow for the collection of spectral data. In a preferred embodiment of the present invention, a three-dimensional fast spin-echo pulse sequence with extended refocusing trains using modulated flip angles is employed. This data acquisition approach provides a significant acceleration of the imaging process compared to conventional chemical shift imaging ("CSI") techniques.

As will be described below, the method of the present invention is compatible with many accelerated imaging techniques, including using a tailored field-of-view, parallel imaging in all three spatial-encoding directions, compressed sensing, partial Fourier sampling and reconstruction, corner cutting, and variable density sampling. Although each of these acceleration techniques reduces SNR, the spectral data samples attainable with the method of the present invention provide a significant gain in SNR that will offset or exceed these SNR losses.

MRI System

Figure 1:
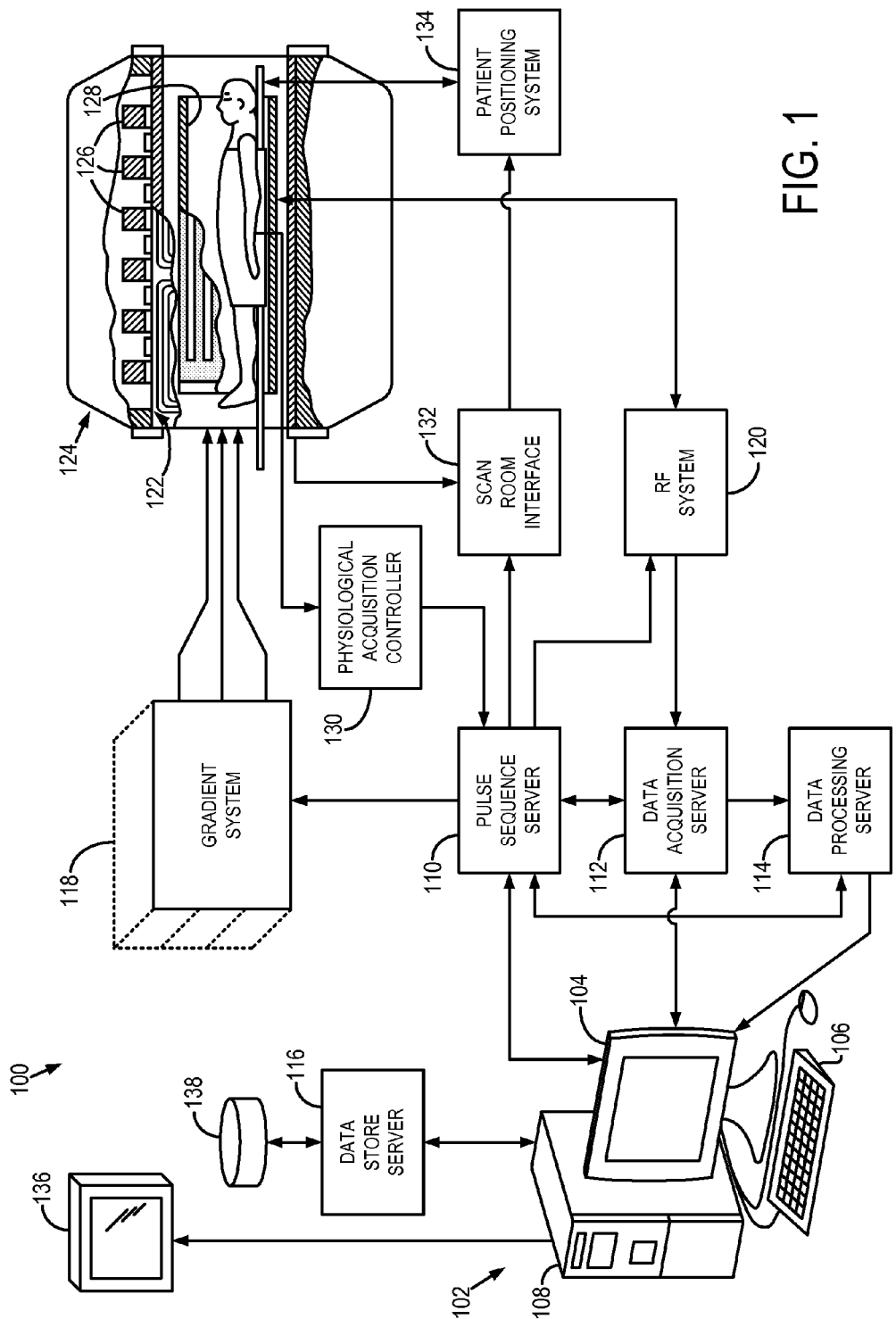
FIG. 1 is a block diagram of an example of a magnetic resonance imaging ("MRI") system.

Referring particularly now to FIG. 1, an example of a magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radio frequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF preamplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \tag{1};$$

and the phase of the received MR signal may also be determined:

$$\varphi = \tan^{-1}\left(\frac{Q}{I}\right). \tag{2}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data are lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data are acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

RF System

Figure 2:
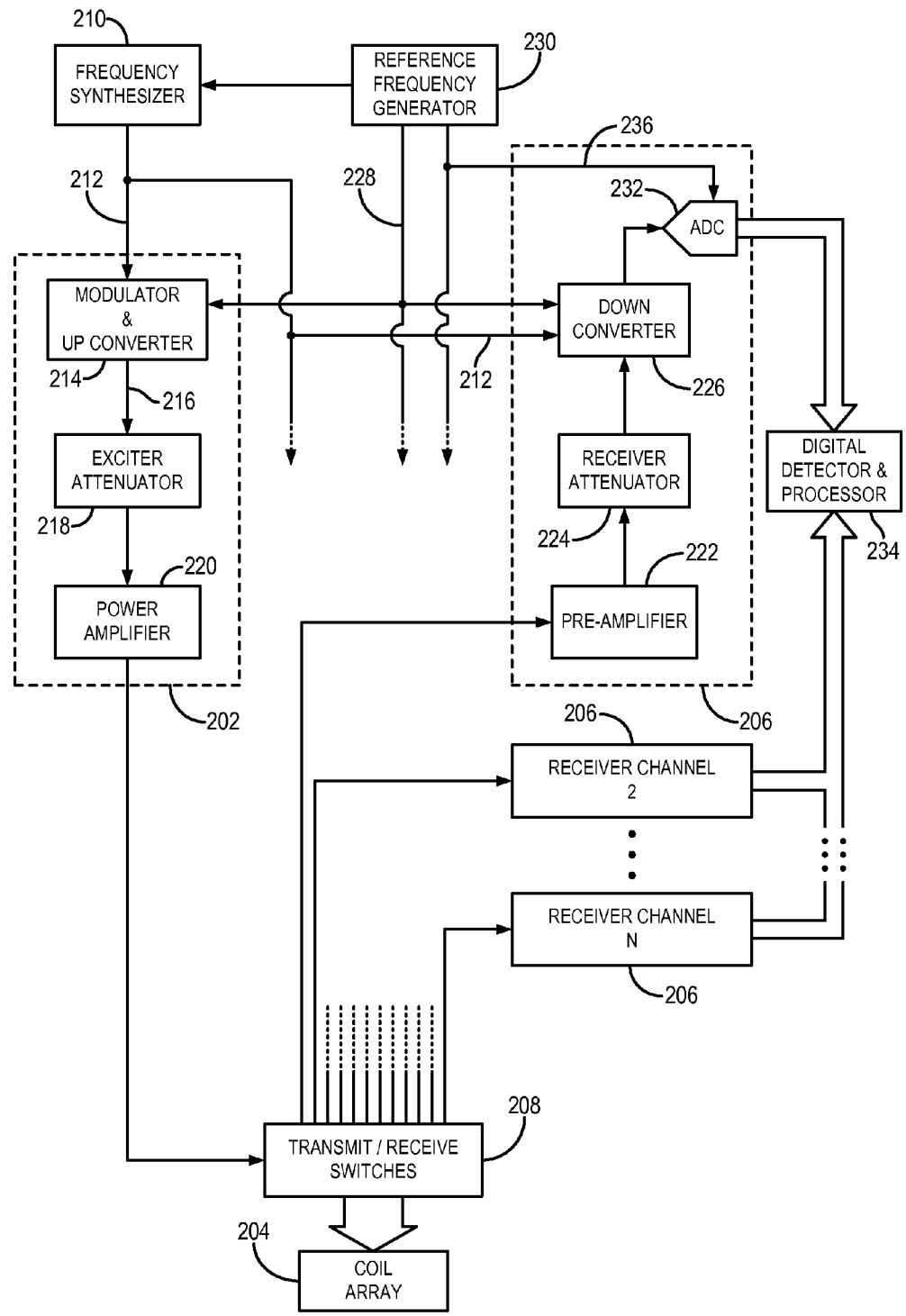
FIG. 2 is a block diagram of an example of a radio frequency ("RF") system that may form a part of the MRI system of FIG. 1.

As shown in FIG. 1, the RF system 120 may be connected to the whole body RF coil 128, or as shown in FIG. 2, a transmitter section of the RF system 120 may connect to at least one transmit channel 202 of a coil array 204, and its receiver section may connect to at least one receiver channel 206 of the coil array 204. Often, the transmitter section is connected to the whole body RF coil 128 or a local transmit coil (not shown), and, in so-called "parallel receiver" coil arrays, each receiver section is connected to a separate receiver channel 206.

Referring particularly to FIG. 2, the RF system 120 includes a transmitter that produces a prescribed RF excitation field. The base, or carrier, frequency of this RF excitation field is produced under control of a frequency synthesizer 210 that receives a set of digital signals from the pulse sequence server 110. These digital signals indicate the frequency and phase of the RF carrier signal produced at an output 212. The RF carrier is applied to a modulator and up converter 214 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 216 is attenuated by an exciter attenuator circuit 218 that receives a digital command from the pulse sequence server 110. The attenuated RF excitation pulses are applied to a power amplifier 220, which drives the RF coil array 204 through a transmit/receive ("T/R") switch 208.

Referring still to FIG. 2, the signal produced by the subject is picked up by the coil array 204 and applied to the inputs of a set of receiver channels 206. A pre-amplifier 222 in each receiver channel 206 amplifies the signal by an amount determined by a digital attenuation signal received from the pulse sequence server 110. The received signal is at or around the Larmor frequency, and this high frequency signal is down-converted in a two step process by a down converter 226, which first mixes the detected signal with the carrier signal on line 212 and then mixes the resulting difference signal with a reference signal on line 228. The down converted MR signal is applied to the input of an analog-to-digital ("A/D") converter 232 that samples and digitizes the analog signal and applies it to a digital detector and signal processor 234 that produces 16-bit in-phase (I) values and 16-bit quadrature (Q) values corresponding to the received signal. The resulting stream of digitized I and Q values of the received signal are output to the data acquisition server 112. The reference signal, as well as the sampling signal applied to the A/D converter 232, are produced by a reference frequency generator 230.

Pulse Sequences

The method of the present invention may be implemented using any number of different pulse sequences. For example, the method of the present invention may be implemented in a three-dimensional pulse sequence that samples a magnetic resonance signal in the form of a free-induction decay, spin echo, or stimulated echo. Additionally, the present invention may be implemented using a three-dimensional pulse sequence that utilizes coherent transverse magnetization from one repetition time period to the next, including gradient-recalled acquisition in the steady-state ("GRASS") and steady-state free precession ("SSFP") pulse sequences.

Figure 3:
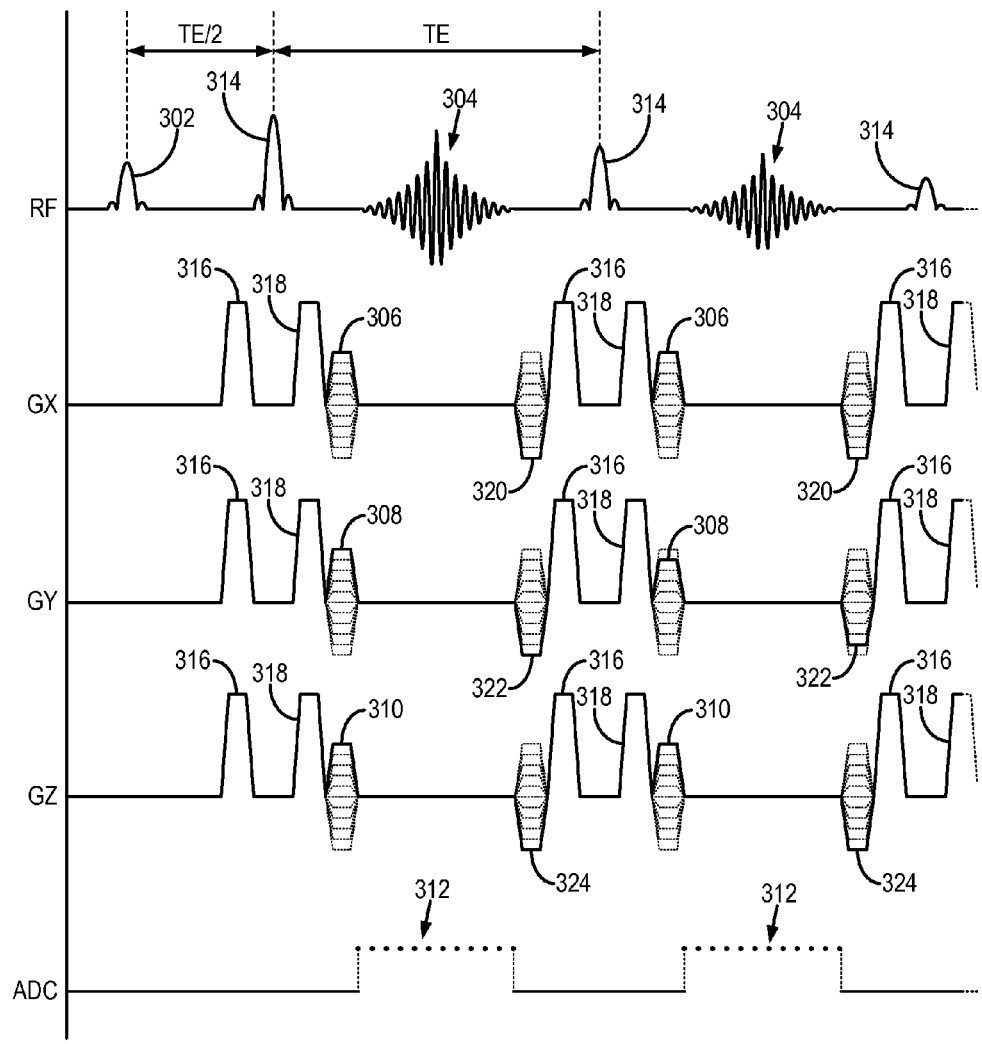
FIG. 3 is an example of a pulse sequence that phase-encodes a magnetic resonance signal, such as spin-echo and stimulated-echo signals, in three dimensions and that does not include a frequency-encoding gradient.

By way of example, a three-dimensional pulse sequence that acquires k-space data by sampling spin-echo magnetic resonance signals is illustrated in FIG. 3. Such a pulse sequence may include a spectrally-resolved fast spin-echo pulse sequence. Because, in this pulse sequence, no frequency-encoding gradient is played out during the formation of the magnetic resonance signal, frequency-encoding-related shift artifacts are avoided. By way of further example, the pulse sequence may include using an excitation scheme with extended refocusing trains using modulated flip angles, an example of which is described by R. F. Busse, et al., in "Fast Spin Echo Sequences with Very Long Echo Trains: Design of Variable Refocusing Flip Angle Schedules and Generation of Clinical T2 Contrast," *Magnetic Resonance in Medicine,* 2006; 55(5): 1030-1037.

Referring now to FIG. 3, an example of a pulse sequence for acquiring three-dimensional k-space data without the use of a frequency-encoding gradient is illustrated. In this example, the pulse sequence is a three-dimensional fast-spin echo pulse sequence. The pulse sequence includes the application of a radio frequency ("RF") excitation pulse 302 that acts to rotate net magnetization about an axis. By way of example, the RF excitation pulse is configured to rotate net magnetization about a rotation axis into a transverse plane such that the net magnetization is converted from longitudinal magnetization into transverse magnetization. After the RF excitation pulse 302 is applied, an RF refocusing pulse 314 is applied in order to refocus dephasing of the transverse magnetization and to form a spin-echo magnetic resonance signal 304. In a pulse sequence where multiple spin-echoes are generated for each RF excitation, it may be advantageous to modulate the flip angle of subsequent RF refocusing pulses 314.

The magnetic resonance signal 304 is spatially-encoded by the application of three phase encoding gradients 306, 308, 310. The first phase-encoding gradient 306 is applied along a first direction, such as the x-direction. The second phase-encoding gradient 308 is established concurrently with the first phase-encoding gradient 306 and is applied along a second direction, such as the y-direction, that is orthogonal to the first direction. The third phase-encoding gradient 310 is established concurrently with the first and second phase-encoding gradients 306, 308 and is applied along a third direction, such as the z-direction, that is orthogonal to the first and second directions. Together, the three phase-encoding gradients 306, 308, 310 spatially-encode the magnetic resonance signal 304. For example, the three phase-encoding gradients 306, 308, 310 define a single point in three-dimensional k-space at which the magnetic resonance signal 304 will be sampled during a data acquisition window 312. Each magnetic resonance signal 304 may be symmetrically sampled through time to provide spectral decomposition and high signal-to-noise ratio ("SNR") performance.

To help ensure that the magnetic resonance signals are in-phase, crusher gradients 316 are applied before each RF refocusing pulse 314. These crusher gradients 316 act as prewinders. In addition, to mitigate the free-induction decay signal generated by the RF refocusing pulse 314, crusher gradients 318 are be applied after the RF refocusing pulse 314. These crusher gradients 316, 318 may not be needed when only a single spin-echo is sampled following RF excitation. It is noted that although the crusher gradients 318 and phase encoding gradients 306, 308, 310 are shown as distinct gradient pulses, in practice these gradient may be combined. After each magnetic resonance signal 304 is formed and sampled, rewinding phase-encoding gradients 320, 322, and 324 are generated before spatially-encoding the next magnetic resonance signal in the echo train.

The echo train of this pulse sequence is repeated a plurality of times and during each repetition one or more of the three phase-encoding gradients 306, 308, 310 is changed so that a different point in three-dimensional k-space is sampled for each subsequent magnetic resonance signal 304 formed in the echo train. By way of example, the amplitude of the three phase-encoding gradients 306, 308, 310 may be stepped through a plurality of values such that k-space is sampled in a sampling pattern defined by the amplitudes of the phase-encoding gradients 306, 308, 310. Because each point in k-space is repeatedly sampled over a period of time when the magnetic resonance signal 304 is generated, each sampled point in k-space will contain information for N different images, where N is the number of time points at which the magnetic resonance signal 304 is sampled at any given point in k-space. This independent sampling yields a significant gain in SNR. As an example, each magnetic resonance echo signal may be sampled 128 times over a period of 8 milliseconds, resulting in a spectral resolution of 122 Hz.

Figure 4A:
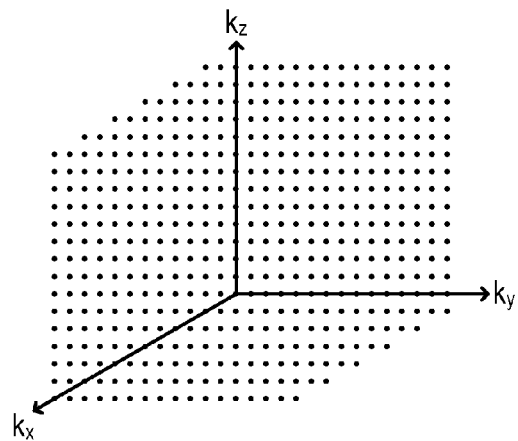
FIGS. 4A-4C are illustrations of examples of k-space sampling patterns that may be implemented when performing methods in accordance with the present invention.
Figure 4B:
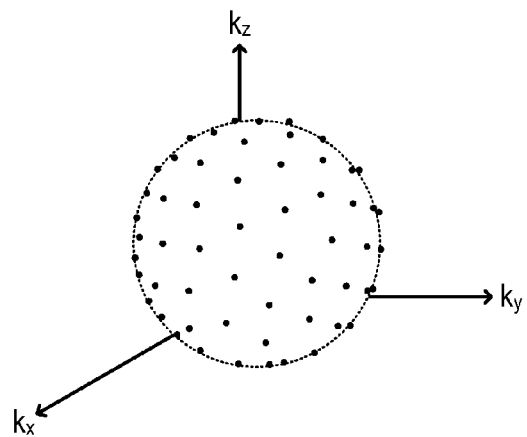
Figure 4C:
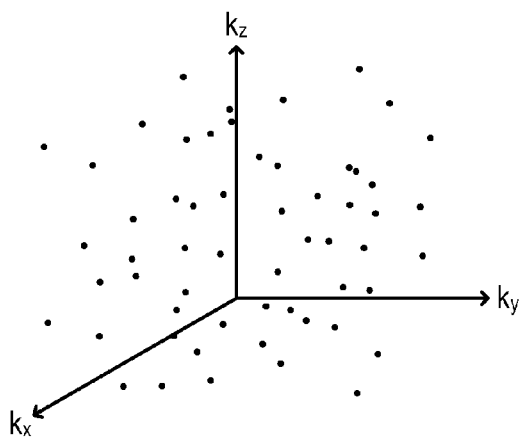

Examples of different k-space sampling patterns are illustrated in FIGS. 4A-4C. In general, however, the present invention provides a system and method for sampling k-space over an arbitrary k-space sampling pattern, and in which the order of the k-space samplings may also be arbitrarily selected. FIG. 4A illustrates an example of a three-dimensional Cartesian sampling pattern that can be implemented with the method of the present invention. Unlike traditional Cartesian k-space sampling, which samples k-space along linear trajectories, the sampling pattern illustrated in FIG. 4A samples k-space at single points on a Cartesian grid. FIG. 4B illustrates an example of a sampling pattern in which k-space is sampled at points distributed on the surface of a spherical shell. A plurality of concentric shells can be sampled in this manner. FIG. 4C illustrates an example of a sampling pattern in which k-space is sampled randomly. Such a sampling pattern is advantageous for compressed sensing-based reconstruction techniques that benefit from a random distribution of samples. It will be appreciated that the examples illustrated in FIGS. 4A-4C are for illustrative purposes only, and that because k-space is sampled one point at a time, any number of different sampling patterns can be implemented. Other examples include sampling at points along radial lines, sampling points along spiral trajectories, sampling different portions of k-space with different sampling densities, and so on. As noted above, the set of k-space points may also be randomly distributed in three-dimensional k-space.

The k-space sampling pattern prescribed by the phase-encoding gradients 306, 308, 310 can also be tailored for parallel imaging or other accelerated imaging techniques. For example, the k-space sampling pattern can be designed such that undersampling is provided along one or more of the phase-encoding directions. Unlike conventional imaging techniques that perform frequency-encoding in one spatial-encoding direction and can perform parallel imaging acceleration in the other two spatial-encoding directions, the method of the present invention can provide parallel imaging acceleration in all three spatial-encoding directions, thereby yielding a significant increase in the acceleration factors that can be attained. By way of example, k-space could be undersampled by a factor of two in each of the phase-encoding directions, thereby yielding an effective acceleration factor of R=2×2×2=8, whereas conventional three-dimensional imaging techniques would be limited to an acceleration factor of four. Other accelerated imaging techniques, such as k-space corner cutting and partial Fourier encoding, may also be implemented to decrease scan time.

Figure 5:
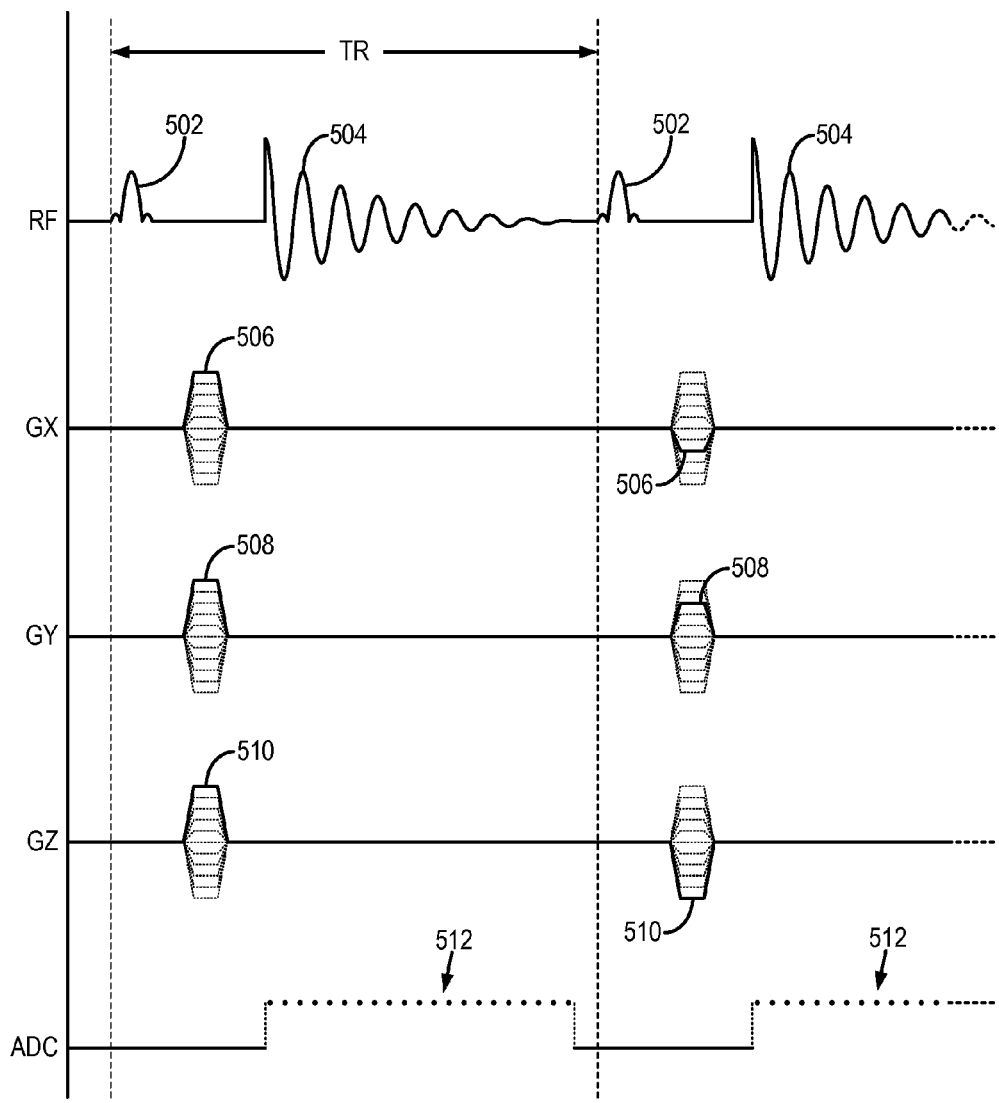
FIG. 5 is an example of a pulse sequence that phase-encodes a magnetic resonance signal, such as a free-induction decay signal, in three dimensions and that does not include a frequency-encoding gradient.

By way of example, a three-dimensional pulse sequence that acquires k-space data by sampling free-induction decay magnetic resonance signals is illustrated in FIG. 5. The pulse sequence includes the production of a radio frequency ("RF") excitation pulse 502. This RF excitation pulse 502 acts to rotate net magnetization about an axis. By way of example, the RF excitation pulse 502 is configured to rotate net magnetization about an axis into a transverse plane such that the net magnetization is converted from longitudinal magnetization into transverse magnetization. When the RF excitation pulse 502 is turned-off the net magnetization relaxes back to an equilibrium state, during which the excited spins emit a magnetic resonance signal 504 in the form of a free-induction decay.

The magnetic resonance signal 504 is spatially-encoded by the application of three phase encoding gradients 506, 508, 510. The first phase-encoding gradient 506 is applied along a first direction, such as the x-direction. The second phase-encoding gradient 508 is established concurrently with the first phase-encoding gradient 506 and is applied along a second direction, such as the y-direction, that is orthogonal to the first direction. The third phase-encoding gradient 510 is established concurrently with the first and second phase-encoding gradients 506, 508 and is applied along a third direction, such as the z-direction, that is orthogonal to the first and second directions. Together, the three phase-encoding gradients 506, 508, 510 spatially-encode the magnetic resonance signal 504. For example, the three phase-encoding gradients 506, 508, 510 define a single point in three-dimensional k-space at which the magnetic resonance signal 504 will be sampled during a data acquisition window 512. Each magnetic resonance signal 504 is sampled at multiple time points to provide spectrally-resolved data that may be used for chemical species separations with very high signal-to-noise ratio ("SNR") performance. High SNR performance is possible with this method because each spectral point has independent noise and will result in considerable effective signal averaging after spectral decomposition has been performed.

This pulse sequence is repeated a plurality of times and during each repetition one or more of the three phase-encoding gradients 506, 508, 510 so that a different point in three-dimensional k-space is sampled. By way of example, the amplitude of the three phase-encoding gradients 506, 508, 510 may be stepped through a plurality of values such that k-space is sampled in a sampling pattern defined by the amplitudes of the phase-encoding gradients 506, 508, 510. Because each point in k-space is repeatedly sampled over a period of time when the magnetic resonance signal 504 is generated, each sampled point in k-space will contain information for N different images, where N is the number of time points at which the magnetic resonance signal 504 is sampled at any given point in k-space. This independent sampling yields a significant gain in SNR. As an example, each magnetic resonance echo signal may be sampled 128 times over a period of 8 milliseconds, resulting in a spectral resolution of 122 Hz.

The method of the present invention can also implement a pulse sequence that incorporates a variable echo time acquisition scheme. With this approach, smaller amplitude phase-encoding gradients can be used to sample echoes that are formed at shorter echo times, and larger amplitude phase-encoding gradients can be used to sample echoes formed at longer echo times.

Data acquired with pulse sequences that implement the present invention can be reconstructed to produce images of the subject using existing image reconstruction techniques. For example, when data are acquired by sampling k-space at points that lie on a three-dimensional Cartesian grid, images can be reconstructed using a convention Fourier transform ("FT") approach. Other image reconstruction techniques may also be used depending on the choice of k-space sampling pattern. For example, backprojection methods, regridding methods with subsequent FT, compressed-sensing based methods, and parallel image methods may all be used.

Pulse sequences that implement the present invention can use a standard FT applied along the time dimension on a voxel-by-voxel basis to produce spectroscopic images. Alternatively, signal modeling can be used to estimate the proton density, $\rho$; transverse magnetization relaxation rate, $R^*_2$; and $B_0$ field map, $\psi$, at each voxel. This signal model can also incorporate multiple chemical species, thereby allowing for separation of the signal contributions of the chemical species, such as in water-fat separation. A magnetic resonance signal for a single chemical species can be modeled as $$S_n(r) = \rho(r) e^{-R_2^*(r)|t_n|} e^{i2\pi\psi(r)t_n} \quad (3)$$

and a magnetic resonance signal for M different chemical species can be modeled as $$S_n(r) = e^{i2\pi\psi(r)t_n} \sum_{m=1}^{M} \rho_m(r) e^{i2\pi\Delta f_m(r)t_n} e^{-R_{2,m}^*(r)|t_n|}; \quad (4)$$

where $S_n(r)$ is the signal measured for a voxel, r; $t_n$ is the time of a sample, n, relative to the echo time; $\rho(r)$ is proton density at the voxel, r; $\Delta f$ is the frequency offset from water; and $\psi(r)$ represents the magnetic field, $B_0$, at the voxel, r. Using a non-linear least squares, or other, curve fitting algorithm, $\rho(r)$, $\psi(r)$, and $R^*_2(r)$ can be estimated from Eqns. (3) or (4).

This method of the present invention is applicable for a number of different clinical and imaging applications, examples of which will now be described.

Imaging Applications

One clinical application that can benefit from the method of the present invention is when magnetic resonance images need to be acquired near metallic implants, which cause significant off-resonance artifacts in images acquired with conventional imaging techniques. Imaging techniques such as MAVRIC, SEMAC, and a hybrid between MAVIRC and SEMAC allow improved imaging near metal objects; however, these imaging techniques still require frequency-encoding, which limits the efficacy of these imaging techniques in voxels with a wide distribution of frequencies. An example of voxels that may exhibit this behavior are those that are adjacent to stainless-steel screws. This limitation of these imaging techniques leads to both signal loss and signal "pile up" artifacts, as described by K. M. Koch, et al., in "Frequency Encoding in the Presence of Extreme Static Field Gradients," *Proceedings of the International Society of Magnetic Resonance in Medicine*, 2011; 293. Because the method of the present invention implements phase-encoding in all spatial dimensions and eliminates frequency-encoding gradients, the associated off-resonance, signal loss, and signal pile up artifacts are avoided. Such distortion-free imaging allows for fat suppression near metal objects.

Another limitation of the MAVRIC, SEMAC, and related methods is their inability to separate fat and water in the images and to suppress fat signal. Separation of water and fat signals or suppression of fat signal is important to visualize fluid, tumor, infection, or other pathologies. The method of the present invention, however, allows for water-fat separation in voxels where signal is present for time scales on the order of 8 milliseconds because the method provides sufficient spectral resolution. Moreover, the method of the present invention also allows water-fat separation because the achievable sampling rate is sufficiently fast to correctly estimate the field map, $\psi$, even in the presence of extreme field inhomogeneities, which is a requirement for reliable water-fat separation.

One requirement for reliable imaging near metal is the ability to excite spins over a wide range of resonance frequencies. The MAVRIC method addressed this requirement by partitioning the large frequency spectrum into smaller bins, exciting and imaging each bin separately, and summing the data over all bins into a final image. In order to minimize artifacts in the readout direction, the MAVRIC method pairs a large readout bandwidth, such as a 125 kHz bandwidth, with a smaller RF excitation bandwidth, such as a 2 kHz bandwidth. Although increasing the RF bandwidth could reduce the number of spectral bins needing during acquisition, such an approach would also require increasing the readout bandwidth, making this approach a very limited option.

By eliminating frequency-encoding related shift artifacts, the method of the present invention has the ability and advantage of better matching the RF and readout bandwidths. In other words, an RF pulse much broader than 2 kHz could be paired with a readout bandwidth much smaller than 125 kHz. It is contemplated that this approach will reduce the number of spectral bins needed for imaging near a metal implant while simultaneously boosting the SNR. Thus, imaging may also be accelerated by using a smaller-field-of-view in the proximity of metal implants, where higher frequency acquisitions may be used.

The method of the present invention also provides advantages for imaging and tracking super paramagnetic iron oxide ("SPIO") contrast agents and SPIO-labeled cells. The spectral data that can be acquired with the method may provide a positive contrast mechanism directly related to concentration of SPIOs, and the ability to simultaneously estimate $R^*_2$ may help determine whether the SPIOs are intracellular or extracellular.

Thus, a system and method for spectrally-resolved three-dimensional magnetic resonance imaging without frequency-encoding gradients have been provided. The system and method are capable of producing distortion-free magnetic resonance images in regions where a rapidly changing magnetic field exists, such as near metal objects. The system and method may also be used to estimate $\rho$, $R^*_2$, and $\psi$ on a voxel-by-voxel basis for chemical species separation, which may allow for high spatial resolution spectroscopic imaging. Preferably, the system and method of the present invention may be implemented by modifying any number of available three-dimensional pulse sequences, such as pulse sequences that sample a magnetic resonance signal in the form of a free-induction decay, spin echo, or stimulated echo. Additionally, the present invention may be implemented by modifying a three-dimensional pulse sequence that utilizes coherent transverse magnetization from one repetition time period to the next, including gradient-recalled acquisition in the steady-state ("GRASS") and steady-state free precession ("SSFP") pulse sequences The present invention has been described in terms of one or more preferred embodiments, and it should be appreciated that many equivalents, alternatives, variations, and modifications, aside from those expressly stated, are possible and within the scope of the invention.

The invention claimed is:

1. A method for acquiring spectrally-resolved, three-dimensional data with a magnetic resonance imaging (MRI) system, the steps of the method comprising:
   directing the MRI system to:
   a) produce a radio frequency (RF) pulse that rotates net magnetization about an axis;
   b) establish a first phase-encoding gradient along a first direction;
   c) establish a second phase-encoding gradient along a second direction that is orthogonal to the first direction;
   d) establish a third phase-encoding gradient along a third direction that is orthogonal to the first direction and the second direction;
   e) produce a refocusing RF pulse that refocuses the rotated net magnetization so as to form a magnetic resonance signal as an echo signal at an echo time; and
   f) acquire spectrally-resolved data at a point in k-space that is defined by the first, second, and third phase-encoding gradients by sampling the magnetic resonance signal at a plurality of time points during a period of time in which no magnetic field gradients are established by the MRI system.

2. The method as recited in claim 1 in which the magnetic resonance signal is at least one of a spin-echo signal and a stimulated echo signal.

3. The method as recited in claim 1 in which the magnetic resonance signal is formed by directing the MRI system to perform a pulse sequence that provides coherent steady-state magnetic resonance signals without a frequency-encoding gradient.

4. The method as recited in claim 1 in which the MRI system is directed to repeat steps a)-f) a plurality of times while each repetition alters at least one of the first, second, and third phase-encoding gradients such that spectrally-resolved data are acquired from a different point in k-space during each repetition, the different points in k-space defining a k-space sampling pattern.

5. The method as recited in claim 4 in which the k-space sampling pattern includes at least one of sampling k-space at points on a Cartesian grid, sampling k-space at points along radial lines, sampling k-space at points along spiral trajectories, and sampling k-space at points that are randomly distributed in three-dimensional k-space.

6. The method as recited in claim 4 in which the k-space sampling pattern includes a variable density of sampling points such that different portions of k-space are sampled with different sampling densities.

7. The method as recited in claim 4 in which the k-space sampling pattern is designed such that undersampling occurs along at least one of the first direction, the second direction, and the third direction.

8. The method as recited in claim 7 in which the k-space sampling pattern is designed such that undersampling occurs along each of the first direction, the second direction, and the third direction.

9. The method as recited in claim 4 in which the k-space sampling pattern is arbitrary and an order in which the different k-space points defining the k-space sampling pattern are selected is arbitrary.

10. The method as recited in claim 1 further comprising:
    g) spectrally decomposing the spectrally-resolved data acquired in step f).

11. The method as recited in claim 10 in which the spectrally-resolved data are spectrally decomposed by Fourier transforming the spectrally-resolved data along a time dimension for each voxel location in a field-of-view.

12. The method as recited in claim 10 in which the spectrally-resolved data are spectrally decomposed by fitting the spectrally-resolved data to a signal model that models magnetic resonance signals associated with at least one chemical species.

13. The method as recited in claim 1 further comprising:
    g) reconstructing an image from the spectrally-resolved data using at least one of a parallel imaging reconstruction, a compressed sensing reconstruction, a partial Fourier reconstruction, a constrained reconstruction, and combinations thereof.

14. The method as recited in claim 1 in which the MRI system is directed to repeat steps b)-f) a plurality of times to form an extended echo train, and while each repetition alters at least one of the first, second, and third phase-encoding gradients such that spectrally-resolved data are acquired from a different point in k-space during each repetition, the different points in k-space defining a k-space sampling pattern.

15. The method as recited in claim 14 in which the extended echo train is formed using a modulated flip angle excitation.

16. A magnetic resonance imaging (MRI) system, comprising:
   a magnet system configured to generate a polarizing magnetic field about at least a portion of a subject arranged in the MRI system;
   a plurality of gradient coils configured to establish at least one magnetic gradient field to the polarizing magnetic field;
   a radio frequency (RF) system configured to apply an RF field to the subject and to receive magnetic resonance signals therefrom;
   a computer system programmed to:
      direct the RF system to produce an RF pulse that rotates net magnetization about an axis;
      direct the plurality of gradient coils to establish a first phase-encoding gradient along a first direction;
      direct the plurality of gradient coils to establish a second phase-encoding gradient along a second direction that is orthogonal to the first direction;
      direct the plurality of gradient coils to establish a third phase-encoding gradient along a third direction that is orthogonal to the first direction and the second direction;
      direct the RF system to produce an RF refocusing pulse that refocuses the rotated net magnetization so as to form a magnetic resonance signal as an echo signal at an echo time:
      direct the RF system to receive the magnetic resonance signal generated in response to the produced RF refocusing pulse;
      acquire spectrally-resolved data at a point in k-space that is defined by the first, second, and third phase-encoding gradients by sampling the received magnetic resonance signal at a plurality of time points during a data acquisition window; and
      direct the plurality of gradient coils not to establish a magnetic field gradient during the data acquisition window.

17. The MRI system as recited in claim 16 in which the computer system is programmed to:
   direct the plurality of gradient coils to repeatedly establish the first phase-encoding gradient, the second phase-encoding gradient, and the third-phase encoding gradient so as to produce an extended echo train, wherein at least one of the first, second, and third phase-encoding gradients is altered during each repetition such at a different k-space point is defined with each repetition;
   direct the RF system to receive a plurality of magnetic resonance signals generated during the extended echo train;
   acquire spectrally-resolved data by sampling the plurality of magnetic resonance signals during a corresponding plurality of data acquisition windows; and
   direct the plurality of gradient coils not to establish a magnetic field gradient during each of the plurality of data acquisition windows.

18. The MRI system as recited in claim 17 in which the computer system is programmed to direct the RF system to produce each RF pulse that rotates net magnetization about an axis according to a modulated flip angle excitation.

19. The MRI system as recited in claim 16 in which the computer system is programmed to:
   acquire spectrally-resolved data by directing the MRI system to repeatedly perform a pulse sequence that includes instructions to produce the RF pulse; establish the first phase-encoding gradient, the second phase-encoding gradient, and the third-phase encoding gradient; to produce the RF refocusing pulse; to acquire data during the data acquisition window; and not to establish magnetic field gradients during the data acquisition window; and
   alter at least one of the first, second, and third phase-encoding gradients during each repetition of the pulse sequence so that the spectrally-resolved data are acquired from different k-space points in accordance with a selected k-space sampling pattern.

20. The MRI system as recited in claim 19 in which the selected k-space sampling pattern includes at least one of k-space points distributed on a Cartesian grid, k-space points distributed along radial lines, k-space points distributed along spiral trajectories, k-space points that are randomly distributed in three-dimensional k-space, and k-space points that are more densely distributed in some portions of three-dimensional k-space than others.

21. The MRI system as recited in claim 19 in which the selected k-space sampling pattern is designed such that undersampling occurs along at least one of the first direction, the second direction, and the third direction.

* * * * *